United States Patent [19]

Wood

[11] 4,454,432
[45] Jun. 12, 1984

[54] POWER EFFICIENT TTL BUFFER FOR DRIVING LARGE CAPACITIVE LOADS

[75] Inventor: Grady M. Wood, Melbourne, Fla.

[73] Assignee: Harris Corp., Melbourne, Fla.

[21] Appl. No.: 300,617

[22] Filed: Sep. 9, 1981

[51] Int. Cl.³ .................. H03K 19/088; H03K 19/013
[52] U.S. Cl. ..................................... 307/456; 307/473; 307/562
[58] Field of Search ................... 307/299 A, 456, 466, 307/473, 562, 475

[56] References Cited

U.S. PATENT DOCUMENTS

| | | | |
|---|---|---|---|
| 3,544,808 | 12/1970 | Mukai | 307/456 |
| 3,581,107 | 5/1971 | Nielsen. | |
| 3,641,368 | 2/1972 | Gamble et al. | |
| 3,699,355 | 10/1972 | Madrazo et al. | 307/456 |
| 4,081,695 | 3/1978 | Allen et al. | 307/473 |
| 4,255,670 | 3/1981 | Griffith | 307/473 |

*Primary Examiner*—John Zazworsky
*Attorney, Agent, or Firm*—Leitner, Palan, Martin & Bernstein

[57] ABSTRACT

A TTL gate for driving large capacitive loads with minimal current drain of the gate's power supply during the logic low output level is provided. The current drain from the power supply is minimized by a feedback means which becomes active when the logic low output level is reached. The feedback means comprises a current mirror circuit connected between the drive means and the output means of the gate. The drive means also comprises a current mirror circuit.

24 Claims, 4 Drawing Figures

POWER EFFICIENT TTL BUFFER FOR DRIVING LARGE CAPACITIVE LOADS

BACKGROUND OF THE INVENTION

The present invention relates, in general, to high speed transistor-transistor logic (TTL) gates for driving output loads. In particular, a TTL gate is provided with a feedback circuit for driving a large capacitive load at high speed while minimizing the average current drain from the gate's power supply.

TTL gates are well-known in the prior art and are widely used commercially. These gates are typically designed to drive loads having a capacitance of approximately 30 pF. or less. When larger capacitive loads are driven, however, the speed of the gate is significantly reduced. This speed loss has been compensated for in the prior art by lowering the values of the resistors used in the gate. This reduction of resistance, however, results in a corresponding and undesirable increase in current drain from the gate power supply. This drain makes the efficient use of the TTL gate prohibitive for driving large capacitive loads.

It is known in the prior art to provide a TTL gate with a feedback circuit for improved gate response. One such circuit is seen in U.S. patent to Gamble et al, U.S. Pat. No. 3,641,368. This patent teaches the use of various feedback techniques for speeding up the turn-on and turn-off times of the gate output transistor. In particular, FIG. 1 of this patent discloses a feedback circuit comprising a transistor $Q_{4C}$ and a diode $CR_3$, connected between the output node 20 and the drive transistor $Q_{4A}$. When the output begins to fall to the logic low state, the transistor $Q_{4C}$ provides additional collector current for the drive transistor $Q_{4A}$. Therefore, since $Q_{4A}$ has more available emitter current, the output transistor $Q_{1A}$ is saturated faster, such that the output node is discharged quicker without a corresponding increase of the collector current $I_{CC}$ drawn from the power supply $V_{CC}$.

It is, therefore, known in the prior art to provide feedback means for a TTL gate to improve gate speed. However, the prior art does not disclose an efficient feedback circuit for a TTL gate which provides high speed response as well as reduction of the supply current $I_{CC}$ such that the gate is capable of driving large capacitive loads.

OBJECTS OF THE INVENTION

It is, therefore, an object of the present invention to provide an integrated TTL inverting gate suitable for use as an output buffer which can drive large capacitive loads with minimal current drain on the gate's power supply.

It is another object of the present invention to provide a TTL gate which can drive a large capacitive load at high speed.

It is a further object of the invention to provide a rapid method of tri-stating a TTL gate with minimal power supply current drain.

It is yet a further object of the invention to provide a TTL gate which is radiation-hardened.

These and other objects are attained in a TTL gate comprising a power supply for supplying collector current to the gate, input means for receiving an input signal, output means responsive to the input signal for providing logic high and low level outputs from the gate at an output node, and drive means connected between the input means and output means for driving the output load with the collector current. In particular, the TTL gate is provided with a feedback means, connected between the output of the drive means and the output means for reducing the collector current when the logic low output level is reached.

The drive means comprises a main drive transistor having a multi-emitter, and a auxiliary drive transistor. The emitter of the auxiliary drive transistor is connected to the first emitter of the main drive transistor to form a first current mirror circuit, which in the preferred embodiment of the invention, is a 3:1 current mirror such that an increase in the drive current available to the output means is provided.

The feedback means includes first and second feedback transistors which have their emitters tied to the output node and their bases tied to the common emitters of the first current mirror. The collector of the first feedback transistor is connected to the second emitter of the main drive transistor while the collector of the second feedback transistor is connected to the output means. The feedback transistors, in the preferred embodiment of the invention, form a second 3:1 current mirror circuit.

In operation, before the output reaches the logic low level, the feedback means and the second emitter of the main drive transistor are inactive. During this period, the drive current is provided to the output means by the first current mirror. As the logic low level is reached, the feedback means turns ON such that the second emitter of the main drive transistor steals some of the current from the first current mirror causing a reduction in the current in the first emitter of the main drive transistor. Since the collector current of the main drive transistor is held constant by the action of a clamp circuit, the current in the emitter of the auxiliary drive transistor tracks the decrease in the current in the first emitter of the main drive transistor. The collector current of auxiliary drive transistor, and thus the power supply collector current, is therefore decreased when the logic low output level is reached.

DESCRIPTION OF THE PREFERRED EMBODIMENTS

Figure 1:
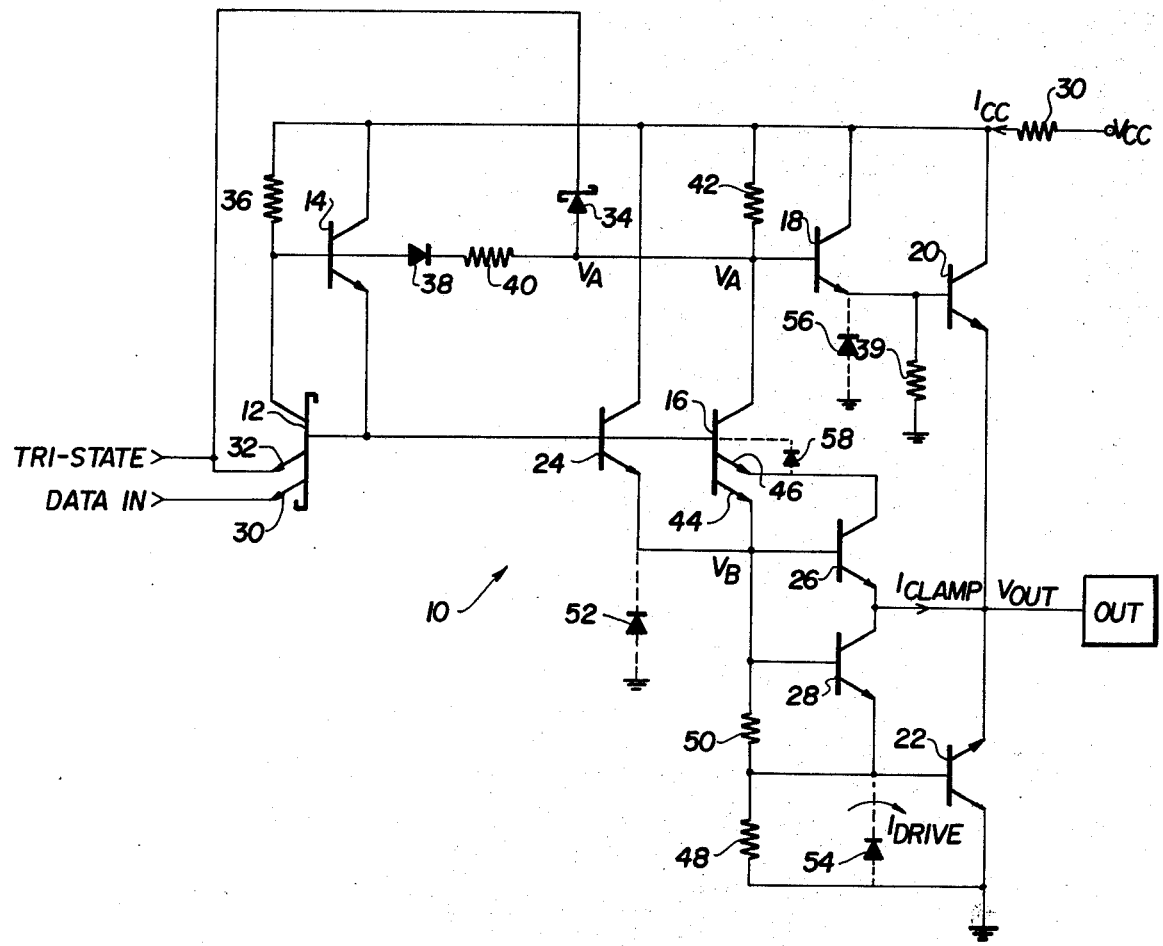
FIG. 1 is a complete schematic of a TTL gate incorporating the principle of the present invention.

The improved TTL gate 10 of the present invention is seen in FIG. 1. More specifically, the basic gate 10 comprises main input transistor 12, auxiliary input transistor 14, main drive transistor 16, pull-up transistors 18 and 20, and output transistor 22. These transistors are conventional and well-known in the prior art. The improved operation of the gate is provided by auxiliary drive transistor 24 and first and second feedback transistors 26 and 28 as will be described in detail below.

Figure 2A:
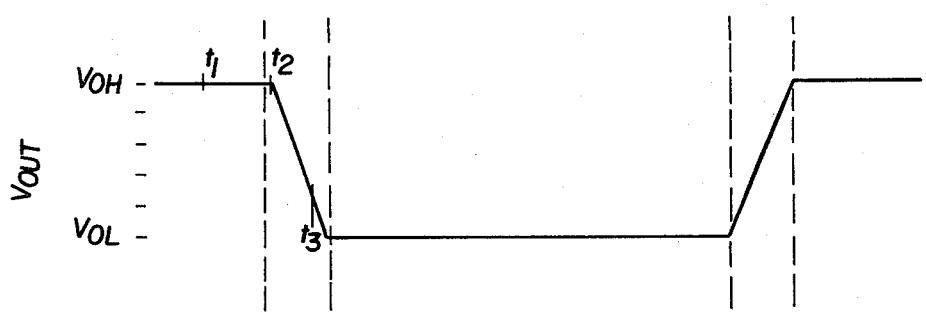
FIG. 2A is a graph of the gate's output during a logic high to logic low to logic high output transition.
Figure 2B:
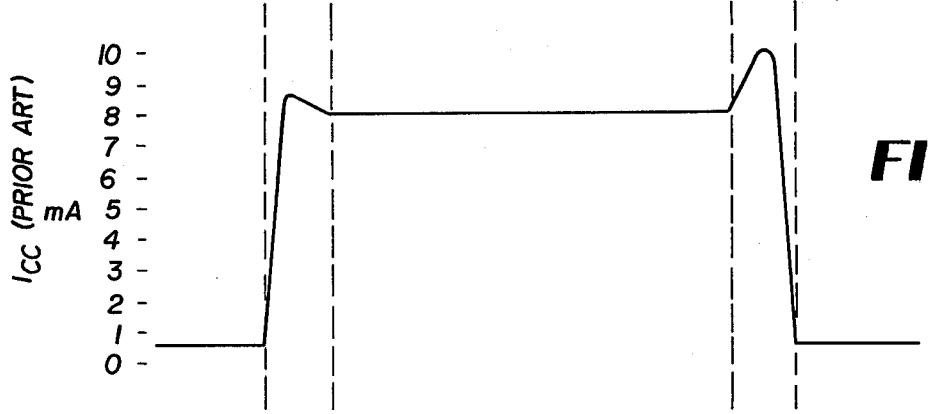
FIG. 2B is a graph of power supply collector current $I_{CC}$ of a prior art TTL gate for the output transitions of FIG. 2A.
Figure 2C:
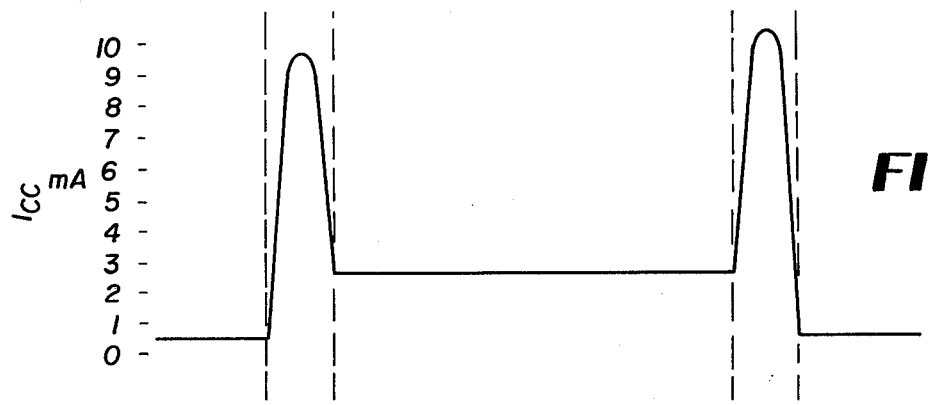
FIG. 2C is a graph of power supply collector current $I_{CC}$ of a TTL gate incorporating the feedback circuit of the present invention for the output transitions of FIG. 2A.

Before describing the circuit of FIG. 1 in detail, the general operation of the circuit can be seen with reference to the signal waveforms shown in FIG. 2. In particular, when the input signal applied to the gate 10 is logic low, the pull-up transistors 18 and 20 are conducting such that the output of the gate is pulled to logic high ($V_{OH}$), as indicated at time $t_1$ in FIG. 2A. The main and auxiliary drive transistors 16 and 24, first and second feedback transistors 26 and 28, and output transistor 22 are cut-off. However, when the input signal applied to the gate 10 starts its low-to-high transition, the gate output begins to fall from logic high to logic low ($V_{OL}$) as seen at time $t_2$ in FIG. 2A, and the drive transistors 16 and 24 begin to conduct. During this transition, the auxiliary input transistor 14 clamps the main drive transistor 16 out of saturation and holds the collector current of this transistor constant. Towards the end of the input low-to-high transition; i.e., at time $t_3$ in FIG. 2A, the feedback transistors 26 and 28 begin to conduct to cause the collector current $I_{CC}$ drawn from the power supply $V_{CC}$ to be reduced, as seen in FIG. 2C. FIG. 2B shows the current $I_{CC}$ as a function of the $V_{OL}$ output without the feedback circuit as described in the prior art. It can be seen that the circuit of the present invention provides for reduction in the current $I_{CC}$ drawn from the power supply when the output of the gate 10 is driven to and maintained at $V_{OL}$. This reduction allows the gate to drive higher capacitive loads as compared to prior art TTL gates.

Referring now to the details of the input circuit of FIG. 1, the input signal is applied to the gate 10 via the DATA-IN line of the main input transistor 12. As can be seen in this figure, the main input transistor 12 has a multi-emitter structure comprising first and second emitters 30 and 32. The DATA-IN line is connected to first emitter 30 while the second emitter 32 is connected to the TRI-STATE input of the gate for providing tri-state operation, as is well-known in the prior art. The main input transistor 12 is a Schottky transistor for improved speed response. The second emitter 32 of the main input transistor 12 is connected through Schottky diode 34 to node $V_A$; i.e., the collector of the main drive transistor 16 and the base of the pull-up transistor 18. The collector of the main input transistor 12 is connected to the supply voltage $V_{CC}$ through the resistors 30 and 36, and to the base of the auxiliary input transistor 14. The base of the main input transistor 12 is tied to the bases of main and auxiliary drive transistors 16 and 24, and is also connected to the emitter of the auxiliary input transistor 14. The collector of the auxiliary input transistor 14 is tied to $V_{CC}$ through resistor 30, while the base thereof is connected to the collector of the main drive transistor 16 through diode 38 and resistor 40. The main and auxiliary input transistors 12 and 14 define an input means of the gate 10 for receiving the input signals.

The power supply $V_{CC}$ is connected to the collectors of pull-up transistors 18 and 20 through resistor 30. These transistors form a Darlington active pull-up amplifier as is well-known in the prior art. This amplifier also includes resistor 39 connected between the base of pull-up transistor 20 and ground. The amplifier is connected between node $V_A$ and output node $V_{OUT}$.

The main and auxiliary drive transistors 16 and 24 have a common base structure as seen in FIG. 1. The collector of the auxiliary drive transistor 24 is connected to $V_{CC}$ through resistor 30 while the emitter thereof is tied to node $V_B$. The collector of the main drive transistor 16 is connected to node $V_A$ and tied to $V_{CC}$ through resistors 30 and 42. The main drive transistor 16 has a multi-emitter structure comprising first and second emitters 44 and 46. The first emitter 44 is tied to the emitter of the auxiliary input transistor 24 at node $V_B$ to form a first current mirror, and to the bases of the first and second feedback transistors 26 and 28. In the preferred embodiment of the invention, the base-emitter area of the auxiliary drive transistor 24 is $3\times$ the emitter area of the first emitter 44 of main drive transistor 16. Therefore, these transistors form a 3:1 current mirror wherein the emitter current of auxiliary drive transistor 24 is $3\times$ the emitter current in the first emitter 44 of main drive transistor 16. The second emitter 46 of main drive transistor 16 is connected to the collector of first feedback transistor 26. The drive transistors 16 and 24 define a drive means for driving the output transistor with the supply current $I_{CC}$.

The output transistor 22 is connected between output node $V_{OUT}$ and ground. Specifically, the collector of output transistor 22 is tied to the emitter of pull-up transistor 20 and to the emitters of first and second feedback transistors 26 and 28. The base of the output transistor 22 is tied to the collector of the second feedback transistor 28, to ground through resistor 48, and to node $V_B$ through resistor 50. The output transistor 22 and resistors 48 and 50 define an output means responsive to the input signal for providing logic high and low level outputs from the gate 10 at output node $V_{OUT}$.

The first and second feedback transistors 26 and 28 have their bases connected to node $V_B$ and their emitters tied to node $V_{OUT}$. In the preferred embodiment of the invention, the emitter area of first feedback transistor 26 is $3\times$ the emitter area of second feedback transistor 28 such that these transistors form a second 3:1 current mirror. The feedback transistors 26 and 28 define a feedback means connected between the drive means and the output means for reducing the current $I_{CC}$ drawn from the power supply $V_{CC}$ when $V_{OL}$ is reached. In particular, the first leg of the second current mirror; i.e., the collector of first feedback transistor 26, is connected to the second emitter 46 of the main drive transistor 16. Similarly, the second leg of the second current mirror, which is the collector of second feedback transistor 28, is connected to the base of output transistor 22 and node $V_B$ of the first current mirror through resistor 50.

Referring again to FIG. 1, the diodes 52, 54, 56 and 58 shown in phantom are compensation diodes which provide radiation hardness. These diodes may be omitted if desired.

The operation of the gate 10 can best be explained with reference to FIG. 1 and the waveforms seen in FIG. 2. In a TTL gate, the output of the gate goes from logic high to logic low when the input thereto goes from logic low to logic high. Therefore, if the DATA-IN line is at logic low, the voltage at output node $V_{OUT}$ is logic high as seen at time $t_1$ in FIG. 2A. With a logic low data input and logic high tri-state input, the emitter 32 of the main input transistor 12 is logic high while emitter 30 is logic low. Under these conditions, the auxiliary input transistor 14 supplies only enough current to drive the base of the main input transistor 12, such that the main and auxiliary drive transistors 16 and 24 are cut-off. Resistor 42 charges the collector node $V_A$ of main drive transistor 16 to keep diode 38 reverse biased. The resistor 42 also supplies base drive to Darlington transistors 18 and 20 such that $V_{OUT}$ is logic high. The output transistor 22 is cut-off, as are first and second feedback transistors 26 and 28.

Assuming now that the DATA-IN line starts its low-to-high transition, such that the voltage at output node $V_{OUT}$ begins to go low as seen at time $t_2$ in FIG. 2A. During the first part of this transition, the first and second feedback transistors 26 and 28 remain cut-off and no current flows in the second emitter 46 of the main drive transistor 16. However, since the tri-state input is logic high, the auxiliary input transistor 14 now becomes a low impedance emitter follower which provides sufficient current to charge the base of main and auxiliary drive transistors 16 and 24, as well as main input transistor 12. As the main drive transistor 16 begins to conduct, its collector voltage drops such that diode 38 becomes forward-biased. When this occurs, diode 38 and resistor 40 shunt base drive away from the auxiliary input transistor 14 such that this transistor cannot supply enough current to saturate the main drive transistor 16. Therefore, it can be seen that diode 38 and resistor 40 serve to clamp the main drive transistor 16 out of saturation and keep the voltage at node $V_A$ constant. This constant collector voltage keeps the collector current of main drive transistor 16 fixed during this part of the gate operation.

In the latter portion of the output high-to-low transition; i.e., at time $t_3$ in FIG. 2A, the feedback means comprising first and second feedback transistors 26 and 28 becomes active to effect minimization of the average current drain from the power supply $V_{CC}$. In particular, as $V_{OL}$ is reached, the second emitter 46 of the main drive transistor 16 becomes active and first and second feedback transistors 26 and 28 begin to conduct. At this stage of the gate operation, it is useful to define two distinct currents, $I_{DRIVE}$ and $I_{CLAMP}$, which are present in the gate. Specifically, $I_{DRIVE}$, which is a portion of $I_{CC}$, is defined as the current in the base circuit of output transistor 22. This current is used to turn-on the output transistor 22 to pull the output to $V_{OL}$. The other current $I_{CLAMP}$, which is defined as the sum of the emitter currents of first and second feedback transistors 26 and 28, is used to ensure that the voltage at output node $V_{OUT}$ does not fall below $V_{OL}$. From a D.C. standpoint, $I_{CLAMP}$ is a wasted current and should be minimized. This minimization is accomplished by the first and second feedback transistors 26 and 28 in conjunction with the main and auxiliary drive transistors 16 and 24, as will be described below.

The operation of the feedback means when $V_{OL}$ is reached can best be understood by examining the magnitudes of the currents $I_{DRIVE}$ and $I_{CLAMP}$ in the various transistors of the gate 10. Referring back to FIG. 1, since $I_{CLAMP}$ is defined as the sum of the emitter currents of first and second feedback transistors 26 and 28, and these transistors form a 3:1 current mirror, it can be seen that the collector currents of these transistors are approximately:

$I_C$ (transistor 26) = ¾$I_{CLAMP}$ $I_C$ (transistor 28) = ¼$I_{CLAMP}$

The second emitter 46 of main drive transistor 16 provides the ¾ $I_{CLAMP}$ for first feedback transistor 26. The first current mirror, comprising the emitter of auxiliary drive transistor 24 and the first emitter 44 of the main drive transistor 16, provide the ¼ $I_{CLAMP}$ for second feedback transistor 28 and the current $I_{DRIVE}$ for the output transistor 22. Since these transistors form a 3:1 current mirror, the emitter of auxiliary drive transistor 24 supplies ¾ $I_{DRIVE}$ while the first emitter 44 of the main drive transistor supplies ¼ $I_{DRIVE}$. Also, the emitter of auxiliary drive transistor 24 supplies ¾th's of the remaining ¼ $I_{CLAMP}$, or 3/16 $I_{CLAMP}$, while the first emitter 44 of main drive transistor 16 supplies ¼th of the remaining ¼ $I_{CLAMP}$, or 1/16 $I_{CLAMP}$.

The currents in the collectors of the main and auxiliary drive transistors 16 and 24 are thus approximately:

$I_C$ (transistor 16) = ¼$I_{DRIVE}$ + 13/16$I_{CLAMP}$ $I_C$ (transistor 24) = ¾$I_{DRIVE}$ + 3/16$I_{CLAMP}$ Note that the 13/16 $I_{CLAMP}$ current in the collector of main drive transistor 16 is derived from the ¾ $I_{CLAMP}$ in emitter 46 and 1/16 $I_{CLAMP}$ in emitter 44. The base current of the drive transistors 16 and 24 has been neglected since diode 38 and resistor 40 have clamped the main drive transistor 16 such that it operates in the active region. Normalizing the above collector currents to main drive transistor 16 illustrates the mirror ratio that exists for $I_{DRIVE}$ and $I_{CLAMP}$:

|  | $I_C$ (transistor 16) | $I_C$ (transistor 24) |
| --- | --- | --- |
| $I_{DRIVE}$ | 1 | 3 |
| $I_{CLAMP}$ | 1 | .231 |

The above table illustrates that the first current mirror provides a 4:1 gain in the current $I_{DRIVE}$ supplied to the base of the output transistor while at the same time $I_{CLAMP}$ is minimized. Note that the gain is 4× $I_{DRIVE}$ which represents the sum of the 3× $I_{DRIVE}$ provided by drive transistor 24, and the 1× $I_{DRIVE}$ provided by drive transistor 16. Referring back to FIG. 1, the minimization of $I_{CLAMP}$ serves to reduce the current $I_{CC}$ drawn from the power supply $V_{CC}$. Specifically, before the feedback transistors are activated, $I_{DRIVE}$ is provided to the output transistor 22 by the first current mirror. As the feedback means turns ON, the second emitter 46 of main drive transistor 16 steals some of the current from the first current mirror causing a reduction in the current in the first emitter 44. Since the collector current of main drive transistor 16 is held constant by the action of diode 38 and resistor 40, the emitter of auxiliary drive transistor 24 tracks the decrease in the current in the first emitter 44 of main drive transistor 16. The collector current of auxiliary drive transistor 24, and thus $I_{CC}$, is therefore correspondingly decreased by a factor of 4:1, given the 3:1 current mirror ratio.

It can, therefore, be seen that the feedback transistors 26 and 28 in conjunction with the drive transistors 16 and 24, provide for improved operation of the gate 10. In particular, the feedback transistors 26 and 28 form feedback means for reducing the current $I_{CC}$ when the output $V_{OL}$ is reached. Since the $I_{CC}$ current is reduced only during the time the gate is at a $V_{OL}$ level no sacrifice in speed results from the overall reduction in average $I_{CC}$. Furthermore, the current required to tri-state the gate is reduced by approximately 3:1 over conventional gates of equivalent speed/load.

Although the invention has been described in detail, it is to be clearly understood that the same is by way of illustration and example only and is not to be taken by way of limitation, the spirit and scope of the invention being limited only to the terms of the appended claims.

What is claimed is:

1. In a TTL gate comprising a power supply for supplying collector current to said gate, input means for receiving an input signal, output means responsive to said input signal for providing logic high and low level outputs from said gate at an output node, and drive means connected between said input means and said output means for driving said output means with said collector current, the improvement comprising:
feedback means, connected between an output of said drive means and said output means, for altering the response of said drive means to substantially reduce said collector current from said power supply when said output node reaches said logic low output level.

2. A TTL gate as defined in claim 1 wherein said drive means is a first current mirror circuit including a main drive transistor having multi-emitters, the first emitter of said main drive transistor forming part of said first current mirror circuit, the second emitter of said main drive transistor connected to said feedback means whereby activation of said feedback means reduces said collector current supplied to said first current mirror circuit.

3. A TTL gate as defined in claim 2 wherein said first current mirror circuit is a ratioed current mirror.

4. A TTL gate as defined in claim 2 wherein said feedback means is a second current mirror circuit having a first leg connected to said second emitter of said main drive transistor and a second leg connected to said output means and said first current mirror circuit.

5. A TTL gate as defined in claim 4 wherein said second current mirror circuit is a ratioed current mirror.

6. A TTL gate as defined in claim 1 wherein said drive means includes a main drive transistor having a collector, base and multi-emitters, and a auxiliary drive transistor having a collector, base, and emitter; said collectors of said main and auxiliary drive transistors being connected to said power supply, said bases of said main and auxiliary drive transistors being tied together; a first emitter of said main drive transistor and said emitter of said auxiliary drive transistor being connected to form a first current mirror means.

7. A TTL gate as defined in claim 6, wherein said first current mirror means is a ratioed current mirror between said emitter of said auxiliary drive transistor and said first emitter of said main drive transistor to provide an increase in the drive current available to drive said output means.

8. A TTL gate as defined in claim 6 wherein said feedback means includes first and second feedback transistors each having a base, collector, and emitter; said collector of said first feedback transistor connected to a second emitter of said main drive transistor, said bases of said first and second feed-back transistors being connected to said first emitter of said main drive transistor and said emitter of said auxiliary drive transistor, said emitters of said first and second feedback transistors being connected to said output node, said collector of said second feedback transistor connected to said output means; said first and second feedback transistors forming a second current mirror means.

9. A TTL gate as defined in claim 8, wherein said second current mirror means is a ratioed current mirror.

10. A TTL gate as defined in claim 2, wherein said input means includes a main input transistor having a base, collector, and multi-emitters, said base of said main input transistor connected to said base of said main drive transistor and said base of said auxiliary drive transistor, said input line forming one of the emitters of said main input transistor.

11. A TTL gate as defined in claim 10, wherein said input means includes an auxiliary input transistor having a base, collector, and emitter; said base of said auxiliary input transistor connected to said collector of said main input transistor, said collector of said auxiliary input transistor connected to said power supply, said emitter of said auxiliary input transistor connected to said base of said main input transistor; said auxiliary input transistor serving to supply base drive to said main input transistor and said drive means.

12. A TTL gate as defined in claim 11, including a series diode and resistor combination connected between said base of said auxiliary input transistor and said collector of said main drive transistor for keeping said main drive transistor out of saturation when the output node goes to the logic low level.

13. A TTL gate as defined in claim 10, wherein the second emitter of said main input transistor is used for tri-state operation of said gate.

14. A TTL gate as defined in claim 1, including pull-up transistor means connected between said power supply and said output means for providing an active pull-up of said output node for improved gate speed.

15. A TTL gate as defined in claim 14, wherein said pull-up transistor means is a Darlington amplifier.

16. A TTL gate as defined in claim 1 including compensation diodes for radiation hardness.

17. A TTL gate for driving large capacitive loads, comprising:
a power supply for supplying collector current to said gate;
input means connected to said power supply, said input means having an input line for receiving an input signal;
output transistor means responsive to said input signal for providing logic high and low level outputs from said gate at an output node;
first current mirror means connected between said input means and said output transistor means for controlling a drive current supplied to said output means in response to said input signal; and
feedback means connected between said first current mirror means and said output transistor means for disrupting the operation of said first current mirror means when said logic low output level is reached such that said collector current is reduced.

18. A TTL gate for driving large capacitive loads as defined in claim 17, wherein said first current mirror means comprises a main drive transistor having a base, collector, and multi-emitters, and an auxiliary drive transistor having a base, collector, and emitter; said emitter of said auxiliary drive transistor being connected to the first emitter of said main drive transistor to form said first current mirror means; said collectors of said main and auxiliary drive transistors being connected to said power supply; said bases of said main and auxiliary drive transistor tied together.

19. A TTL gate for driving large capacitive loads as defined in claim 18, wherein said first current mirror means is an n:1 current mirror which provides a n+1:1 increase in said drive current available to drive said output transistor means.

20. A TTL gate for driving large capacitive loads as defined in claim 18, wherein said feedback means comprises first and second feedback transistors each having a base, collector, and emitter; said collector of said first feedback transistor connected to the second emitter of said main drive transistor, said bases of said first and second feedback transistors being connected to said first emitter of said main drive transistor, said emitters of said first and second feedback transistors being connected to said output node; said collector of said second feedback transistor connected to said output transistor means.

21. A TTL gate for driving large capacitive loads as defined in claim 20, wherein said feedback means is a n:1 current mirror which provides a n+1:1 decrease in said collector current supplied to said output means.

22. A TTL gate for driving large capacitive loads as defined in claim 17, wherein said input means includes a means for tri-stating said gate.

23. A TTL gate for driving large capacitive loads as defined in claim 17, including active pull-up means connected between said power supply and said output transistor means for providing an active pull-up of said output node for improved gate speed.

24. A TTL gate for driving large capacitive loads as defined in claim 17 including compensation diodes for radiation hardness.

* * * * *